United States Patent
Wang et al.

(10) Patent No.: US 11,683,950 B2
(45) Date of Patent: Jun. 20, 2023

(54) DISPLAY PANEL AND ELECTRONIC DEVICE INCLUDING DRAINAGE STRUCTURE AND ISOLATION RING

(71) Applicant: BOE TECHNOLOGY GROUP CO., LTD., Beijing (CN)

(72) Inventors: Bei Wang, Beijing (CN); Jia Zhao, Beijing (CN); Xiaobo Du, Beijing (CN); Haidong Wu, Beijing (CN); Huameng Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 100 days.

(21) Appl. No.: 17/332,018

(22) Filed: May 27, 2021

(65) Prior Publication Data

US 2022/0102668 A1    Mar. 31, 2022

(30) Foreign Application Priority Data

Sep. 28, 2020 (CN) .......................... 202011044926.2

(51) Int. Cl.
| | |
|---|---|
| *H01L 51/52* | (2006.01) |
| *H01L 27/32* | (2006.01) |
| *H10K 50/842* | (2023.01) |
| *H10K 50/844* | (2023.01) |

(52) U.S. Cl.
CPC ....... *H10K 50/8428* (2023.02); *H10K 50/844* (2023.02)

(58) Field of Classification Search
CPC ............... H01L 51/525; H01L 51/5253; H01L 51/5206; H01L 27/3258; H01L 27/326; G02F 2001/133357; H10K 50/8428; H10K 50/844; H10K 50/81; H10K 59/124; H10K 59/121
See application file for complete search history.

(56) References Cited

U.S. PATENT DOCUMENTS

| | | | |
|---|---|---|---|
| 10,541,380 B1* | 1/2020 | Sung | H01L 27/3246 |
| 2019/0288047 A1* | 9/2019 | Jeong | H01L 51/5253 |
| 2020/0052051 A1* | 2/2020 | Lee | H01L 27/1248 |
| 2020/0083475 A1* | 3/2020 | Kang | H01L 51/5256 |
| 2020/0119304 A1* | 4/2020 | Choi | H01L 51/52 |
| 2020/0175900 A1* | 6/2020 | Han | G06F 3/0443 |
| 2020/0235180 A1* | 7/2020 | Park | H01L 27/3276 |
| 2020/0235333 A1* | 7/2020 | Sung | H01L 51/5253 |
| 2020/0303478 A1* | 9/2020 | Lee | H01L 51/5092 |
| 2020/0303677 A1* | 9/2020 | Lee | H01L 27/3225 |
| 2021/0151715 A1* | 5/2021 | Lee | H01L 27/3258 |
| 2021/0226163 A1* | 7/2021 | Ji | H10K 71/00 |
| 2021/0234122 A1* | 7/2021 | Choi | H01L 51/56 |
| 2021/0273029 A1* | 9/2021 | Bang | H01L 51/5253 |
| 2021/0408511 A1* | 12/2021 | Qin | H01L 27/3246 |

* cited by examiner

*Primary Examiner* — Ida M Soward
(74) *Attorney, Agent, or Firm* — Westman, Champlin & Koehler, P.A.

(57) ABSTRACT

A display panel and an electronic device are provided. The display panel includes: an opening area; a display area surrounding the opening area; at least one isolation ring, wherein at least a part of the at least one isolation ring is located between the display area and the opening area, and the at least one isolation ring surrounds the opening area; and a drainage structure extending from a sidewall of an isolation ring in the at least one isolation ring along a straight line passing through a center of the isolation ring.

16 Claims, 16 Drawing Sheets

DISPLAY PANEL AND ELECTRONIC DEVICE INCLUDING DRAINAGE STRUCTURE AND ISOLATION RING

CROSS-REFERENCE TO RELATED APPLICATION(S)

This present disclosure claims priority to Chinese Patent Application No. 202011044926.2 filed on Sep. 28, 2020, the whole disclosure of which is incorporated herein by reference.

TECHNICAL FIELD

The present disclosure relates to a field of display technology, and in particular to a display panel and an electronic device.

BACKGROUND

With a development of the display technology, an organic light-emitting diode (OLED) display device is one of research focuses in a field of a flat panel display device. The OLED display device has attracted people's attention due to its bright colors, a good viewing angle, a high contrast, a fast response speed, a good flexibility, low power consumption and other advantages. The OLED display device has a wide application prospect in a future display field, and the OLED display device has wide application areas in multiple display fields such as mobile display, vehicle display, and medical display.

For a display device with a camera function, such as a mobile terminal, a high screen-to-body ratio is increasingly required. In recent years, a display screen with an ultra-high screen-to-body ratio has developed rapidly.

SUMMARY

In an aspect of the present disclosure, a display panel is provided, including: an opening area; a display area surrounding the opening area; at least one isolation ring, wherein at least a part of the at least one isolation ring is located between the display area and the opening area, and the at least one isolation ring surrounds the opening area; and a drainage structure extending from a sidewall of an isolation ring in the at least one isolation ring along a straight line passing through a center of the isolation ring.

In some embodiments, the drainage structure extends from a sidewall of the isolation ring toward the opening area, and the sidewall of the isolation ring faces the opening area.

In some embodiments, the drainage structure extends from a sidewall of the isolation ring toward the display area, and the sidewall of the isolation ring is away from the opening area.

In some embodiments, the display panel includes a base substrate; and a first isolation ring, a second isolation ring, and a third isolation ring arranged on the base substrate, wherein the first isolation ring, the second isolation ring and the third isolation ring are sequentially arranged away from the opening area, and at least a part of the third isolation ring is located in the display area.

In some embodiments, each of the first isolation ring, the second isolation ring, and the third isolation ring includes a first planarization layer and a first passivation layer sequentially stacked on the base substrate, wherein an orthographic projection of the first planarization layer on the base substrate falls within an orthographic projection of the first passivation layer on the base substrate, and an area of the orthographic projection of the first planarization layer on the base substrate is smaller than an area of the orthographic projection of the first passivation layer on the base substrate.

In some embodiments, the display panel includes a first drainage structure, a second drainage structure, and a third drainage structure, wherein the first drainage structure extends from a sidewall of the first isolation ring toward the opening area, the second drainage structure extends from a sidewall of the second isolation ring toward the opening area, and the third drainage structure extends from a sidewall of the third isolation ring toward the opening area; and wherein each of the first drainage structure, the second drainage structure, and the third drainage structure includes a second planarization layer and a second passivation layer sequentially stacked on the base substrate, wherein an orthographic projection of the second planarization layer on the base substrate falls within an orthographic projection of the second passivation layer on the base substrate, and an area of the orthographic projection of the second planarization layer on the base substrate is smaller than an area of the orthographic projection of the second passivation layer on the base substrate.

In some embodiments, the first planarization layer and the second planarization layer are an integral structure, and the first passivation layer and the second passivation layer are an integral structure.

In some embodiments, a width of the first planarization layer in a direction parallel to the base substrate is 3 to 10 μm, and an extension length of the second planarization layer in a direction extending from the display area toward the opening area is 1.5 to 3 μm.

In some embodiments, for two adjacent isolation rings in the at least one isolation ring, a distance between a sidewall, away from the opening area, of a first planarization layer of one of the two adjacent isolation rings and a sidewall, close to the opening area, of a first planarization layer of another one of the two adjacent isolation rings is 3 to 5 μm.

In some embodiments, the first isolation ring, the second isolation ring, and the third isolation ring are concentric, the first isolation ring, the second isolation ring and the third isolation ring have a same first center, and the first drainage structure extends toward the first center from a sidewall of the first isolation ring that faces the first center, the second drainage structure extends toward the first center from a sidewall of the second isolation ring that faces the first center, and the third drainage structure extends toward the first center from a sidewall of the third isolation ring that faces the first center.

In some embodiments, a plurality of drainage structures are provided on each of the first isolation ring, the second isolation ring, and the third isolation ring, and the plurality of drainage structures are distributed uniformly on a sidewall of each of the first isolation ring, the second isolation ring, and the third isolation ring, and the sidewall of each of the first isolation ring, the second isolation ring, and the third isolation ring faces the first center.

In some embodiments, for two adjacent isolation rings in the at least one isolation ring, an extension direction of at least one drainage structure extending from one of the two adjacent isolation rings is same as an extension direction of at least one drainage structure extending from another one of the two adjacent isolation rings.

In some embodiments, a plurality of drainage structures extending from a same isolation ring have a same extension length.

In some embodiments, an extension length of the first drainage structure extending from the first isolation ring closest to the opening area is greater than an extension length of the second drainage structure extending from the second isolation ring, and is greater than an extension length of the third drainage structure extending from the third isolation ring.

In some embodiments, for two adjacent isolation rings in the at least one isolation ring, a plurality of drainage structures extending from an isolation ring in the two adjacent isolation rings that is away from the opening area are spaced apart from an isolation ring in the two adjacent isolation rings that is close to the opening area by a distance.

In another aspect of the present disclosure, an electronic device including the display panel as described above is provided.

BRIEF DESCRIPTION OF THE DRAWINGS

Other features, purposes and advantages of the present disclosure will become more apparent through the following detailed description of non-limiting embodiments in conjunction with the drawings, and in the drawings.

DETAILED DESCRIPTION OF EMBODIMENTS

Figure 1:
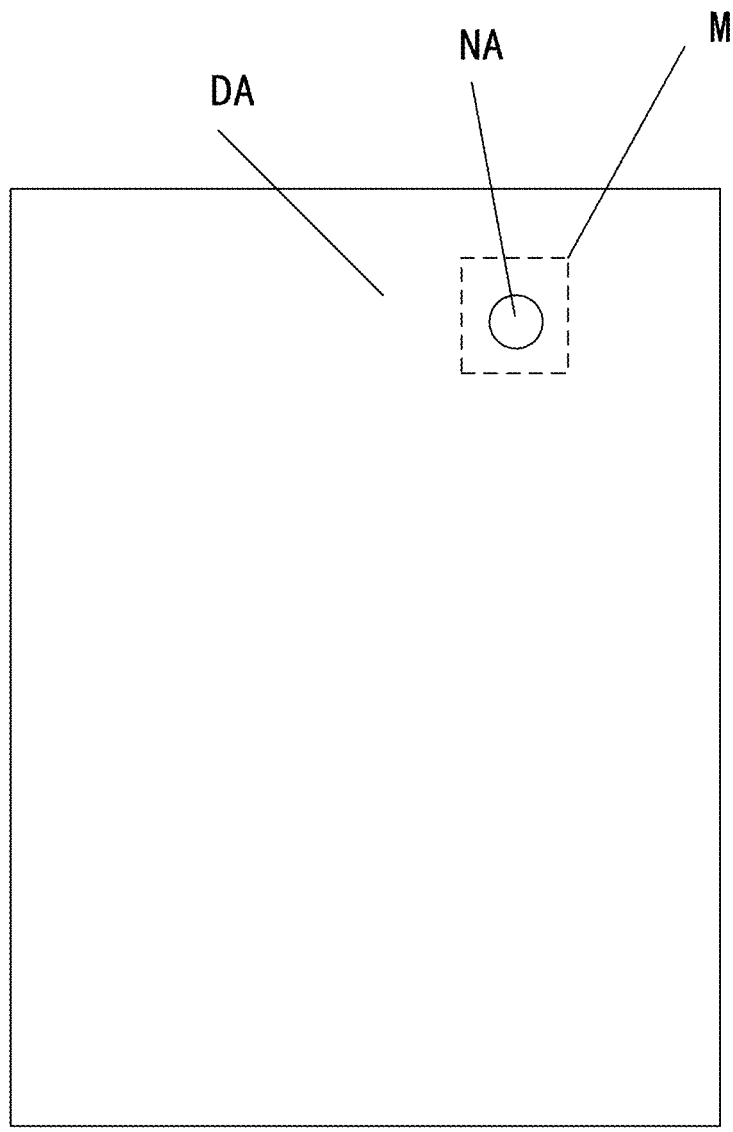
FIG. 1 shows a schematic diagram of a planar structure of a display panel according to the embodiments of the present disclosure.

The present disclosure will be further described in detail below with reference to the accompanying drawings and embodiments. It may be understood that the specific embodiments described here are only used to explain the present disclosure, but not to limit the present disclosure. In addition, it should be noted that, for ease of description, only parts related to the present disclosure are shown in the drawings.

It should be noted that the embodiments in the present disclosure and features in the embodiments may be combined with each other if there is no conflict.

In addition, in the following detailed description, for convenience of explanation, many specific details are set forth to provide a comprehensive understanding of the embodiments of the present disclosure. However, one or more embodiments may further be implemented without the specific details.

It should be understood that, terms "first", "second", etc. may be used herein to describe various elements, but the elements should not be limited by the terms. The terms are only used to distinguish one element from another. For example, without departing from the scope of the exemplary embodiments, a first element may be named as a second element, and similarly, a second element may be named as a first element. The term "and/or" as used herein includes any combination and all combinations of one or more of related items listed.

It should be understood that when an element or a layer is referred to as being "formed on" another element or layer, the element or layer may be directly or indirectly formed on the another element or layer. That is, for example, there may be an intermediate element or an intermediate layer. In contrast, when an element or layer is referred to as being "directly formed on" another element or layer, there is no intermediate element or intermediate layer. Other terms used to describe a relationship between elements or layers should be interpreted in a similar manner (for example, "between" and "directly between", "adjacent" and "directly adjacent", etc.).

The terms used herein are only for describing specific embodiments, and are not intended to limit the embodiments. As used herein, a singular form is further intended to include a plural form unless a context clearly indicates otherwise. It may further be understood that when terms "comprising" and/or "including" are used herein, it means that the features, wholes, steps, operations, elements and/or components exist, but do not exclude an existence or addition of one or more other features, wholes, steps, operations, elements, components, and/or combinations thereof.

In the present disclosure, expressions "located on a same layer" and "arranged on a same layer" generally mean that a first component and a second component may have a same material and may be formed using a same patterning process, unless otherwise specified. Expressions "located on different layers" and "arranged on different layers" generally mean that the first component and the second component are formed using different component processes.

FIG. 1 shows a schematic diagram of a planar structure of a display panel according to the embodiments of the present disclosure. As shown in FIG. 1, a display panel 100 includes: a non-display area NA; and a display area DA surrounding the non-display area NA. In order to increase a screen-to-body ratio of the display panel, a feasible manner is to punch in the non-display area NA surrounded by the display area DA. In some embodiments, an electronic device (such as a communication terminal) including the display panel may be provided with an image acquisition device such as a front camera at the punched position, so that external light may enter the image acquisition device through an opening in the non-display area NA.

Figure 2:
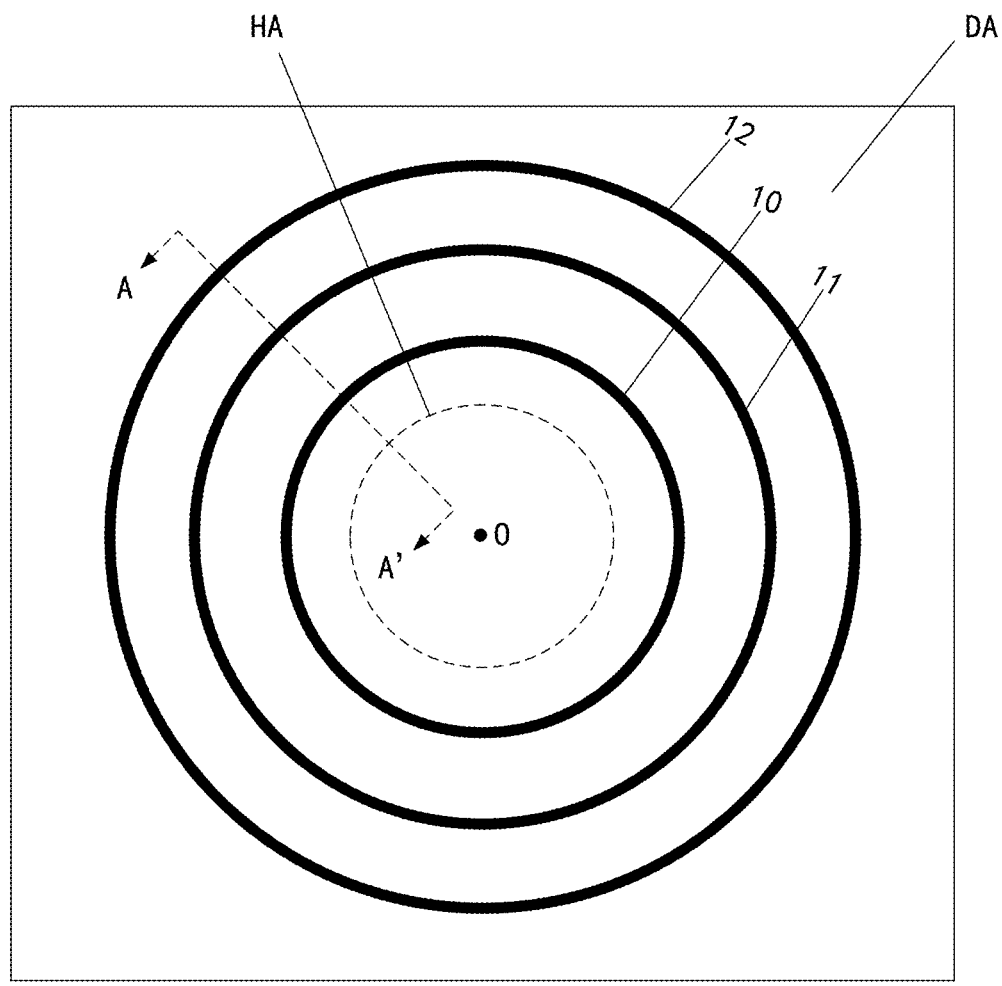
FIG. 2 schematically shows an enlarged diagram of an area M in FIG. 1.
Figure 3:
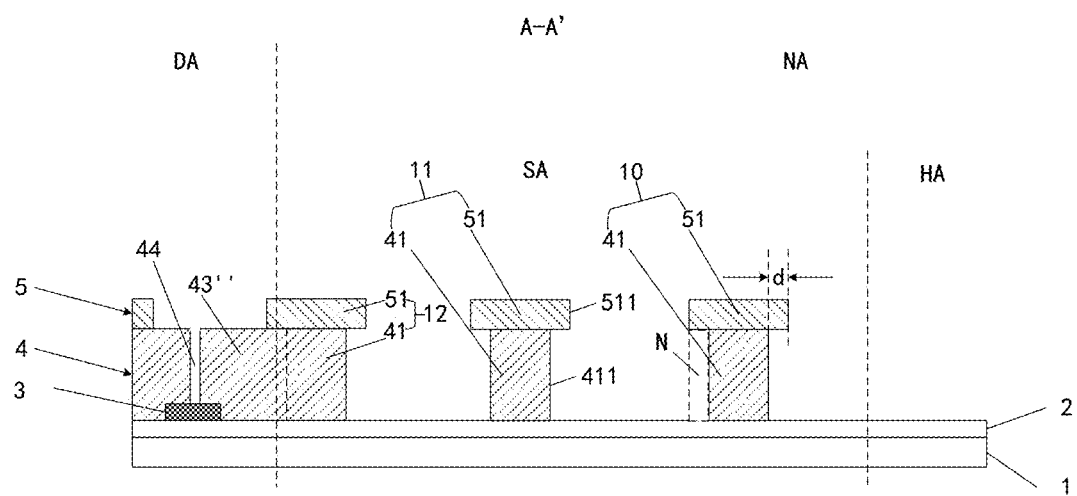
FIG. 3 shows a cross-sectional view of the structure in FIG. 2 taken along A-A'.

FIG. 2 schematically shows an enlarged diagram of an area M in FIG. 1. FIG. 3 shows a cross-sectional view of the structure in FIG. 2 taken along A-A'. As shown in combination with FIGS. 2 and 3, the non-display area NA includes: an opening area HA; and an isolation area SA between the opening area HA and the display area DA, and the isolation area SA surrounds the opening area HA. After the manufacturing of the display panel is completed, a hole may be punched in the opening area HA. For example, a part of the display panel 100 located in the opening area HA may be removed by laser cutting, that is, the display panel 100 is cut along a dotted line shown in FIG. 2 to obtain the opening.

As shown in FIG. 2, a first isolation ring 10, a second isolation ring 11, and at least a part of a third isolation ring 12 is arranged in the isolation area SA, and the first isolation ring 10, the second isolation ring 11, and the third isolation ring 12 are sequentially arranged away from the opening area HA. The first isolation ring 10, the second isolation ring 11, and the third isolation ring 12 separate the opening area HA from the display area DA, so that air, water, etc. are prevented from entering the display area DA from the outside to affect display elements (such as OLEDs) in the display area after the opening area HA is punched. In other embodiments, any number, for example, less than three or more than three, of isolation rings may be arranged in the isolation area SA.

In some embodiments, a plurality of isolation rings may be concentric. For example, as shown in FIG. 2, the first isolation ring 10, the second isolation ring 11 and the third isolation ring 12 have a same first center O.

As shown in FIG. 3, the display panel 100 includes a base substrate 1, and a buffer layer 2, a switch element 3, a planarization layer 4, and a passivation layer 5 sequentially arranged on the base substrate 1. For example, the switch element 3 may be a TFT element. The isolation rings may be formed in a process of patterning the planarization layer 4 and the passivation layer 5. For example, as shown in FIG. 3, each of the first isolation ring 10, the second isolation ring 11, and the third isolation ring 12 includes a first planarization layer 41 and a first passivation layer 51 sequentially stacked on the base substrate 1. An orthographic projection of the first planarization layer 41 on the base substrate 1 falls within an orthographic projection of the first passivation layer 51 on the base substrate 1, and an area of the orthographic projection of the first planarization layer 41 on the base substrate 1 is smaller than an area of the orthographic projection of the first passivation layer 51 on the base substrate 1. That is, a dimension (such as a length) of the first passivation layer 51 is greater than a dimension (such as a length) of the first planarization layer 41 in a direction parallel to the base substrate 1.

In some embodiments, the plurality of isolation rings have a same structure and a same dimension. In some embodiments, an isolation ring, adjacent to the display area DA, in the plurality of isolation rings has a different structure and a different dimension from other isolation rings in the plurality of isolation rings. In some embodiments, the plurality of isolation rings may have different structures and dimensions from each other.

As shown in FIG. 3, as the first isolation ring 10 and the second isolation ring 11 have a same structure and a same dimension, the detailed description for the first isolation ring 10 is omitted here. For the second isolation ring 11, in the direction parallel to the base substrate 1, a sidewall 411 of the first planarization layer 41 facing the opening area HA is recessed inward with respect to a sidewall 511 of the first passivation layer 51 on the first planarization layer 41 facing the opening area HA. A distance d between the sidewall 511 of the first passivation layer 51 and the corresponding sidewall 411 of the first planarization layer 41 in the direction parallel to the base substrate 1 is 0.2 to 0.5 μm, and an area in which the distance d is located is referred to as an undercut area N of the first planarization layer 41 with respect to the first passivation layer 51. For ease of illustration, the distance d and the undercut area N are shown at the first isolation ring 10. The undercut area N is caused by a process of manufacturing the display panel 100, and a value of the distance d is further determined by the process of manufacturing the display panel 100.

As shown in FIG. 3, a third planarization layer 43" may be formed in the process of patterning the planarization layer 4 and the passivation layer 5. A part of the third planarization layer 43" is located in the display area DA, and another part of the third planarization layer 43" is located in the isolation area SA. The third planarization layer 43" is located on a side of the switch element 3 away from the base substrate 1. The third planarization layer 43" and the first planarization layer 41 of the third isolation ring 12 which is farthest away from the opening area HA in the non-display area NA are an integral structure (the integral structure may be denoted by a reference number 43).

A process of manufacturing the display panel 100 is described below. FIGS. 4 to 10 schematically show cross-sectional views of a display panel after each step in a process of manufacturing the display panel is completed according to the embodiments of the present disclosure. FIGS. 4 to 10 are all cross-sectional views taken along A-A' in FIG. 2.

Figure 4:
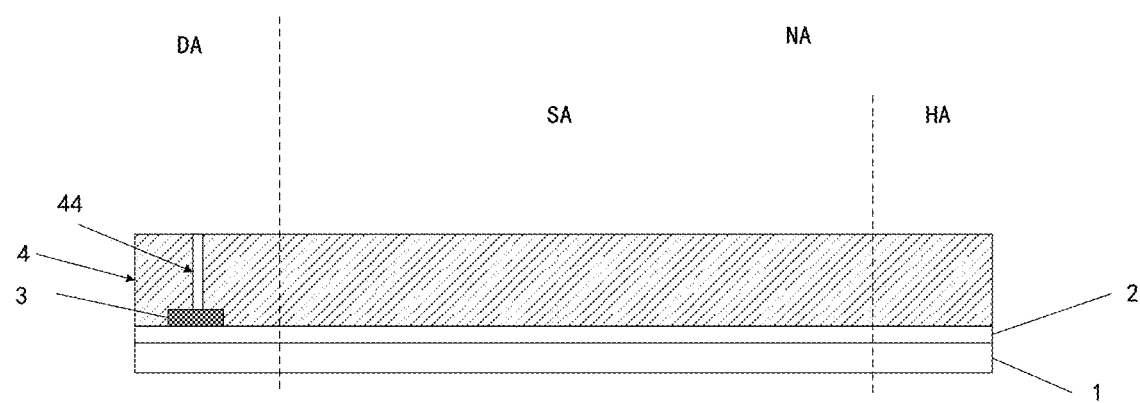
FIGS. 4 to 10 schematically show cross-sectional views of a display panel after each step in a process of manufacturing the display panel is completed according to the embodiments of the present disclosure.

As shown in FIG. 4, the buffer layer 2 and the switch element 3 are sequentially formed on the base substrate 1. Those skilled in the art may understand that in other embodiments, the buffer layer 2 may be omitted.

The planarization layer 4 is formed on an entire surface of the base substrate 1 on which the switch element 3 is formed. For example, the planarization layer 4 may be made of SiN, $SiO_2$ or organic materials. A via hole 44 is formed in the planarization layer 4 using the patterning process. The via hole 44 is located at the switch element 3 and exposes a part of the switch element 3, for example, a part of a source of the switch element 3 or a part of a drain of the switch element 3.

Figure 5:
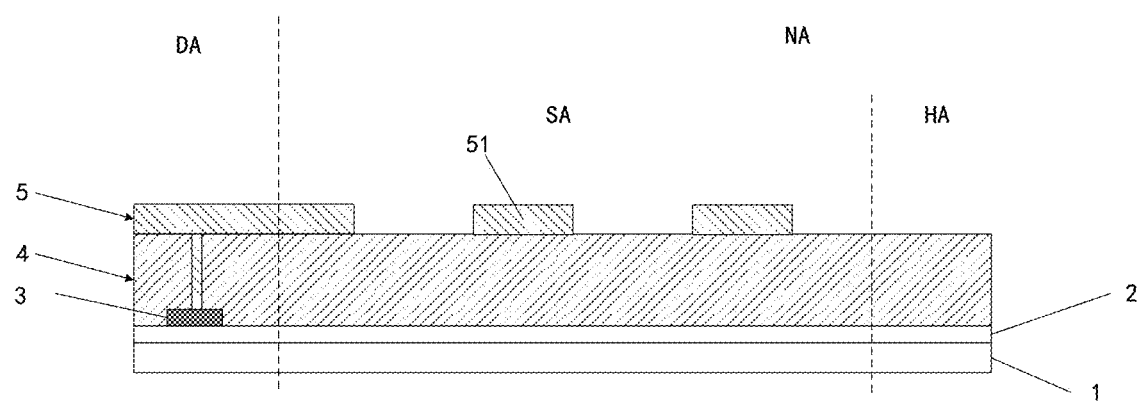

As shown in FIG. 5, the passivation layer 5 is formed on an entire surface of the structure shown in FIG. 4. The passivation layer 5 may be made of a material such as SiN, $SiO_2$, etc. A passivation layer pattern may be formed in the non-display area NA using the patterning process. For example, the first passivation layer 51 is formed in the non-display area NA. The passivation layer 5 in the display area DA completely covers the planarization layer 4 and fills the via hole 44 in the planarization layer 4.

Figure 6:
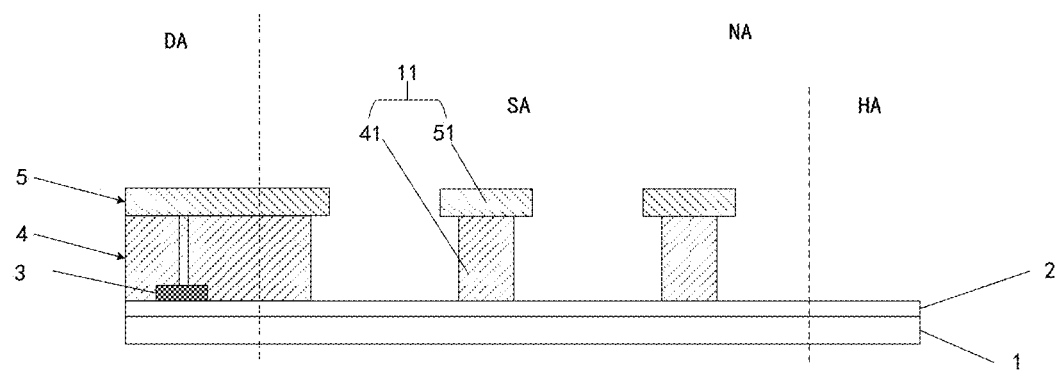

As shown in FIG. 6, the first passivation layer 51 in the non-display area NA is used as a mask to etch the planarization layer 4 in the non-display area NA, so as to form the first planarization layer 41. For example, the stacked first planarization layer 41 and first passivation layer 51 form the second isolation ring 11. Due to characteristics of the planarization layer 4 in the non-display area NA, the planarization layer 4 may be etched in a direction perpendicular to the base substrate 1 and in the direction parallel to the base substrate 1. An etching rate of the planarization layer 4 in the direction perpendicular to the base substrate 1 is greater than an etching rate of the planarization layer 4 in the direction parallel to the base substrate 1. Therefore, the first planarization layer 41 formed in this etching step is recessed inward with respect to the first passivation layer 51 thereon, thereby forming the undercut area N as shown in FIG. 3. In the embodiments, the second isolation ring 11 is taken as an example for description, and formations of the first isolation ring 10 and the third isolation ring 12 is similar to the formation of the second isolation ring 11.

Based on the structure shown in FIG. 6, the passivation layer 5 in the display area DA is patterned to expose the via hole 44 in the passivation layer 4 and a part of the passivation layer 4 adjacent to the via hole 44. Thus, the structure shown in FIG. 3 is obtained.

Figure 7:
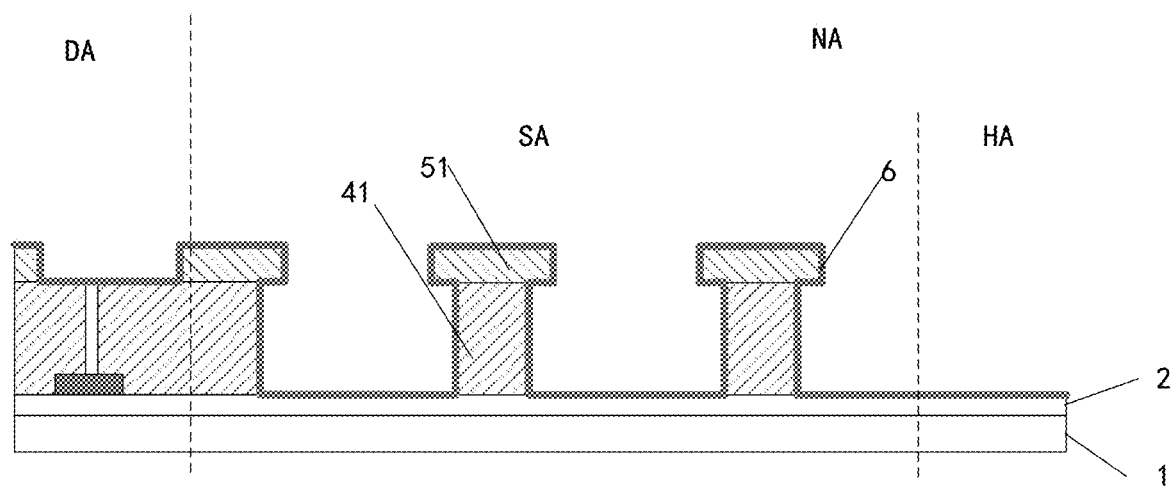

As shown in FIG. 7, based on the structure shown in FIG. 3, a first electrode layer 6 is formed in the display area DA and the non-display area NA. For example, the first electrode layer 6 is made of a metal material or ITO, and is subsequently used to form a display element, such as an anode of an OLED, in the display area DA.

Figure 8:
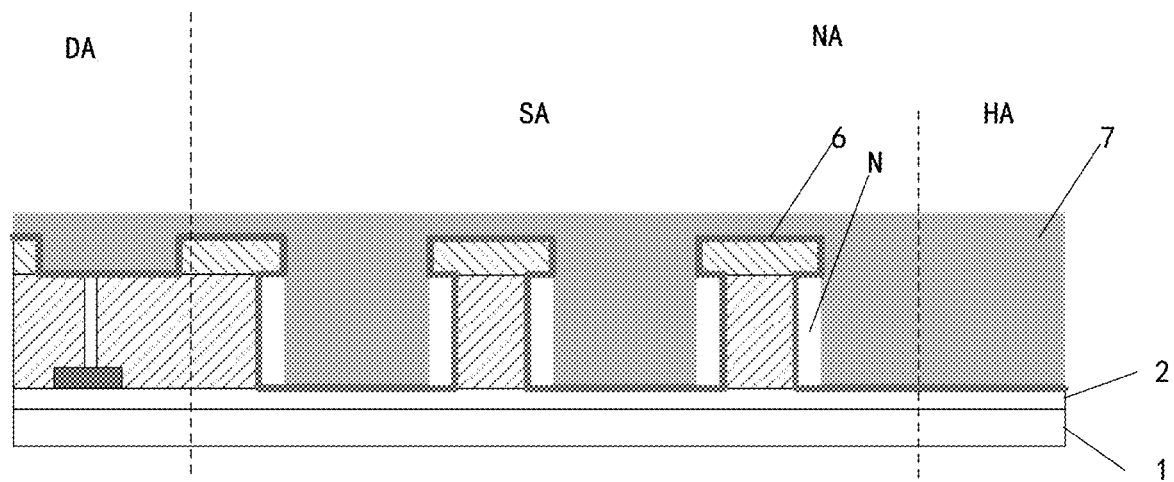

As shown in FIG. 8, based on the structure shown in FIG. 7, a photoresist layer 7 is formed in the display area DA and the non-display area NA. The photoresist layer 7 is used to pattern the first electrode layer 6 in a subsequent process to form an anode pattern. For example, the photoresist layer 7 may be patterned into a pattern required by the anode, and the first electrode layer 6 may be patterned into an anode having a predetermined pattern by using the patterned photoresist layer 7. Due to the existence of the undercut area N, the photoresist layer 7 may not fill the undercut area N completely when the photoresist layer 7 is coated. Therefore, some gases, such as air, may remain in the undercut area N and may be sealed by the photoresist layer 7.

Before patterning the photoresist layer 7, an HVCD (Hot Vacuum Dry) process may be performed on the photoresist layer 7 to remove a solvent in the photoresist layer 7. In addition, a Soft-Bake process may be performed on the photoresist layer 7 to cure the photoresist layer 7, so as to facilitate a subsequent patterning.

Figure 9:
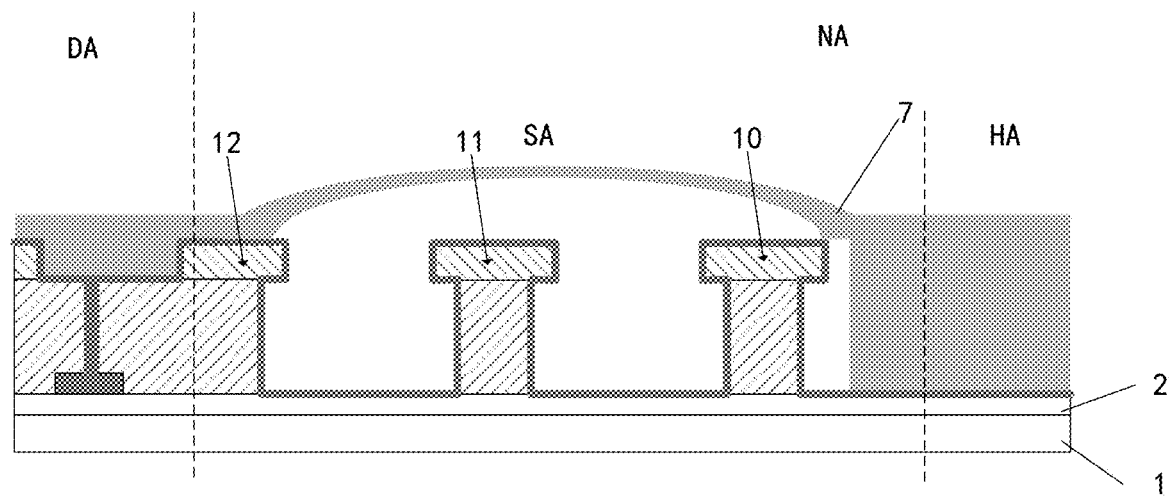

The gas in the undercut area N is sealed by the photoresist layer 7. As shown in FIG. 9, when the HVCD process is performed on the structure shown in FIG. 8, bubbles may be generated between the first isolation ring 10, the second isolation ring 11, and the third isolation ring 12. The bubbles may push up the photoresist layer 7 covering the first isolation ring 10, the second isolation ring 11, and the third isolation ring 12.

Figure 10:
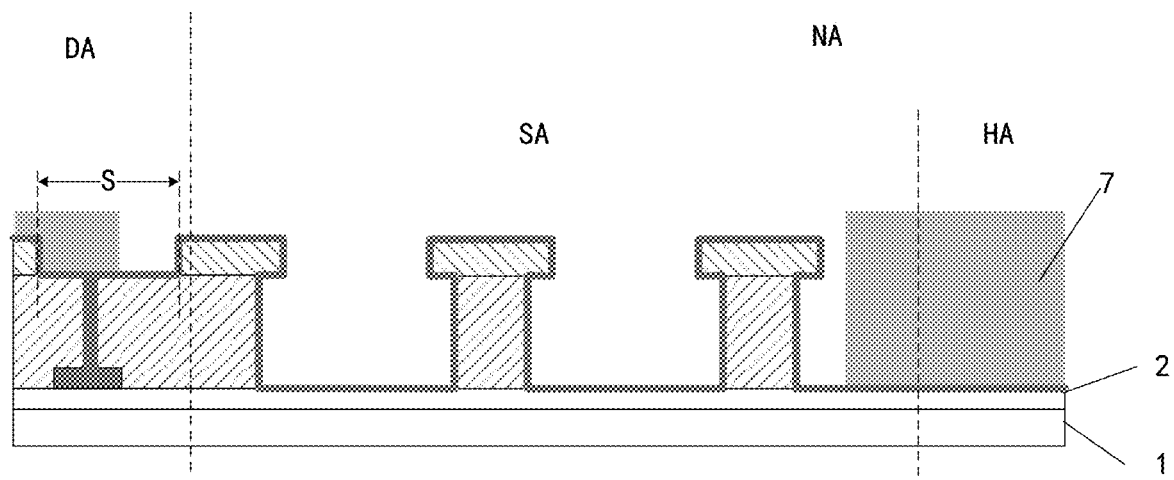

As shown in FIG. 10, during the Soft-Bake process, the bubbles may burst, which takes away the photoresist layer covered in the display area DA adjacent to the third isolation ring 12, for example, takes away a part of the photoresist layer in an area S shown in FIG. 10. However, the photoresist layer 7 in the area S of the display area DA needs to be retained, so as to form the anode of the display element in the area S. The burst of the bubbles takes away a part of the photoresist layer 7 in the area S, resulting in the first electrode layer 6 in the area S be etched partly in the subsequent formation of the anode. This will result in the display element including the anode failing to display normally, causing a poor display of the display panel.

The gas in the undercut area N sealed by the photoresist layer 7 fails to be discharged smoothly during the HVCD process and the Soft-Bake process, thereby generating the bubbling and the bursting of the photoresist and leading to the defect mentioned above.

In order to overcome the problem described above, a display panel is provided according to the embodiments of the present disclosure. The display panel includes: an opening area, a display area, at least one isolation ring and a drainage structure. The display area surrounds the opening area. A part of the at least one isolation ring locates between the display area and the opening area, and the at least one isolation ring surrounds the opening area. The drainage structure extends from a sidewall of an isolation ring in the at least one isolation ring along a straight line passing through a center of the isolation ring. The gas in the undercut area N sealed by the photoresist layer 7 may be discharged smoothly during the HVCD process and the Soft-Bake process by further providing the drainage structure. The photoresist layer may not bubble and burst. The photoresist layer in the area S of the display area DA shown in FIG. 10 is completely retained. The photoresist layer 7 may be patterned subsequently, and the first electrode layer may be etched using a photoresist pattern to form the anode, so that the anode in the area S is a pre-designed anode pattern.

Figure 11:
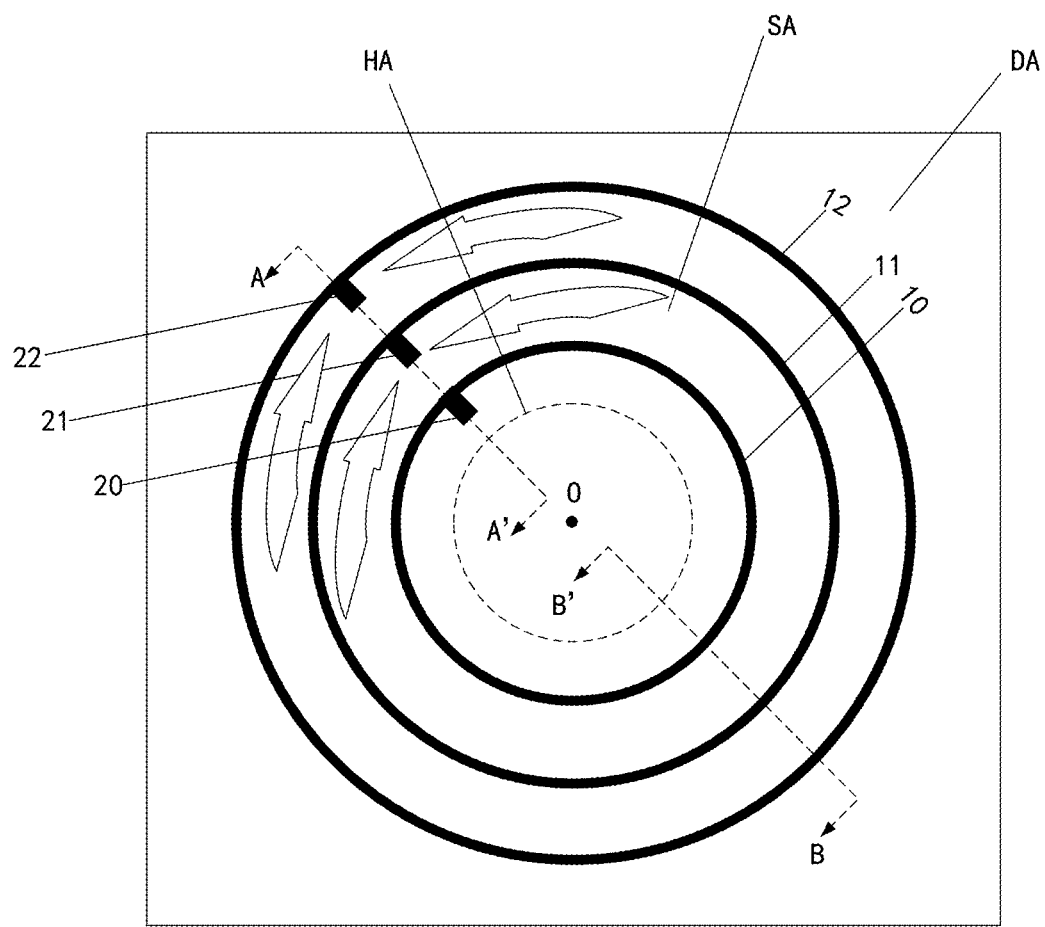
FIG. 11 schematically shows an enlarged diagram of an area M in FIG. 1.

FIG. 11 schematically shows an enlarged diagram of an area M in FIG. 1. The structure in FIG. 11 is substantially the same as the structure shown in FIG. 2. A difference is that the display panel 100 further includes a first drainage structure 20, a second drainage structure 21, and a third drainage structure 22. The first drainage structure 20 extends from a sidewall of the first isolation ring 10 toward the opening area HA. The second drainage structure 21 extends from a sidewall of the second isolation ring 11 toward the opening area HA. The third drainage structure 22 extends from a sidewall of the third isolation ring 12 toward the opening area HA. In FIGS. 2 and 11, each of the first isolation ring 10, the second isolation ring 11, and the third isolation ring 12 is circular as an example. Those skilled in the art may understand that, in other embodiments, the first isolation ring 10, the second isolation ring 11, and the third isolation ring 12 may further have other shapes, such as a square, a hexagon, an irregular shape, etc.

In some embodiments, the plurality of isolation rings is concentric, that is, the plurality of isolation rings has the same first center O. If each of the plurality of isolation rings is circular, as shown in FIG. 11, the plurality of isolation rings have a same center O. For a single isolation ring, for example, the second isolation ring 11, the second drainage structure 21 extends toward the first center O of the second isolation ring 11 from a sidewall of the second isolation ring 11 that faces the opening area HA.

Figure 12:
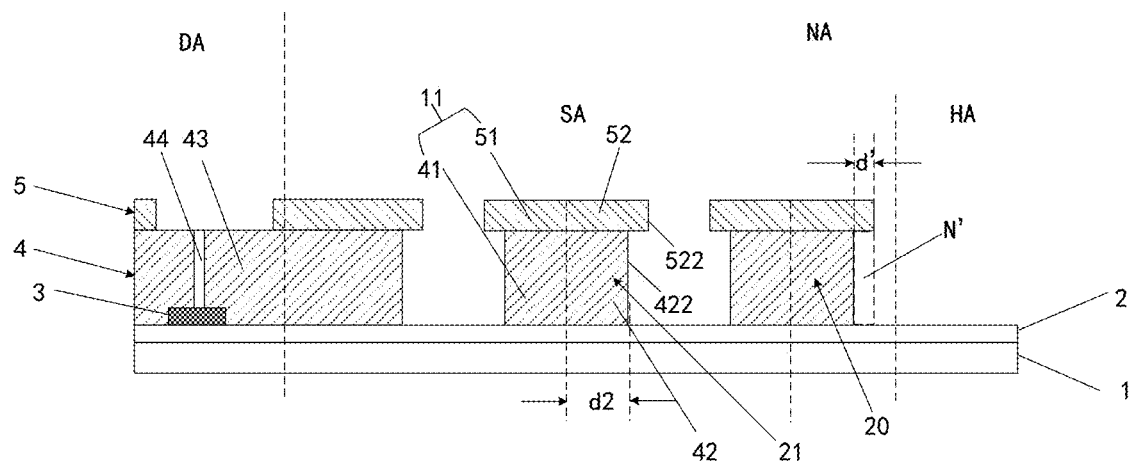
FIG. 12 shows a cross-sectional view of the structure in FIG. 11 taken along A-A'.
Figure 13:
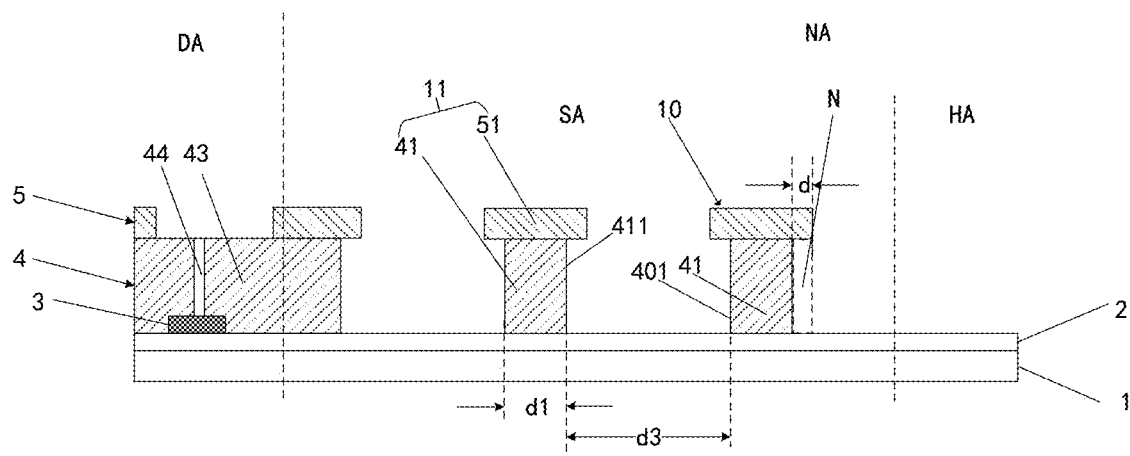
FIG. 13 shows a cross-sectional view of the structure in FIG. 11 taken along B-B.

FIG. 12 shows a cross-sectional view of the structure in FIG. 11 taken along A-A', and FIG. 13 shows a cross-sectional view of the structure in FIG. 11 taken along B-B'. Taking the second isolation ring 11 as an example, as shown in FIG. 12, the second drainage structure 21 includes a second planarization layer 42 and a second passivation layer 52 sequentially stacked on the base substrate 1. An orthographic projection of the second planarization layer 42 on the base substrate 1 falls within an orthographic projection of the second passivation layer 52 on the base substrate 1. An area of the orthographic projection of the second planarization layer 42 on the base substrate 1 is smaller than an area of the orthographic projection of the second passivation layer 52 on the base substrate 1.

In some embodiments, as shown in FIGS. 11 and 12, the first planarization layer 41 of the second isolation ring 11 and the second planarization layer 42 of the second drainage structure 21 are an integral structure, and the first passivation layer 51 of the second isolation ring 11 and the second passivation layer 52 of the second drainage structure 21 are an integral structure. That is, the first planarization layer 41 of the second isolation ring 11 and the second planarization layer 42 of the second drainage structure 21 are formed integrally using a same process and a same material, and the first passivation layer 51 of the second isolation ring 11 and the second passivation layer 52 of the second drainage structure 21 are formed integrally using a same process and a same material. The description above is further applicable to the first isolation ring 10 and the third isolation ring 12.

As shown in FIG. 12, an undercut area N' may exist at an edge of the integral structure formed by the second isolation ring 11 and the second drainage structure 21 extending from the sidewall of the second isolation ring 11, due to the characteristics of the manufacturing process described above. That is, at the edge of the integral structure, a sidewall 422 of the second planarization layer 42 facing the opening area HA is recessed inward with respect to a sidewall 522 of the second passivation layer 52 thereon facing the opening area HA in the direction parallel to the base substrate 1. A distance d' between the sidewall 522 of the second passivation layer 52 and the corresponding sidewall 422 of the second planarization layer 42 in the direction parallel to the base substrate 1 is 0.2 to 0.5 µm. The first isolation ring 10 and the second isolation ring 11 have a same structure, and the first drainage structure 20 and the second drainage structure 21 have a same structure. For ease of illustration, the distance d' and the undercut area N' are shown at the first drainage structure 20 in FIG. 12.

In some embodiments, a width d1 of the first planarization layer 41 of the second isolation ring 11 in the direction parallel to the base substrate 1 is 3 to 10 µm. An extension length d2 of the second planarization layer 42 of the second drainage structure 21 in a direction extending from a sidewall of the second isolation ring 11 that faces the opening area HA toward the center O of the second isolation ring 11 is 1.5 to 3 µm.

As shown in FIGS. 11 to 13, the first drainage structure 20 extends from the sidewall of the first isolation ring 10 toward the opening area HA, the second drainage structure 21 extends from the sidewall of the second isolation ring 11 toward the opening area HA, and the third drainage structure 22 extends from the sidewall of the third isolation ring 12 toward the opening area HA. Therefore, during the manufacturing process of the display panel 100, gas in the undercut area N' sealed by the photoresist layer 7 may be discharged from an edge of the drainage structure perpendicular to an extension direction of the drainage structure in the HVCD process and the Soft-Bake process. Thus, the bubbling and the bursting shown in FIGS. 9 and 10 may not occur. For example, the second drainage structure 21 extends from the second isolation ring 11 toward the center of the second isolation ring 11. Thus, the extension direction of the second drainage structure 21 may be substantially perpendicular to an inner sidewall of the second isolation ring 11 which the second drainage structure 21 extends from. In this case, during the HVCD process and the Soft-Bake process, the gas sealed by the photoresist layer 7 expands, and the photoresist layer 7 in the non-display area NA tends to generate cracks at the edge of the second drainage structure 21 perpendicular to the extension direction of the second drainage structure 21. Therefore, the gas may be discharged from the cracks, without bubbling and bursting. And thus the photoresist layer 7 close to the third isolation ring 12 in the display area DA may be retained intact, which facilitates the subsequent formation of the anode having a predetermined shape and a predetermined dimension.

In some embodiments, as shown in FIG. 13, for two adjacent isolation rings in the at least one isolation ring, a distance d3 between a sidewall 401, away from the opening area HA, of the first planarization layer 41 of the first isolation ring 10 and a sidewall 411, close to the opening area HA, of the first planarization layer 41 of the second isolation ring 11 may be 3 to 5 µm, for example.

In some embodiments, for two adjacent isolation rings in the at least one isolation ring, a drainage structure extending from an isolation ring in the two adjacent isolation rings that is away from the opening area HA are spaced apart from an isolation ring in the two adjacent isolation rings that is close to the opening area HA by a distance. That is, it is avoided that a drainage structure extending from one isolation ring connects two adjacent isolation rings together. Otherwise, the gas sealed by the photoresist layer 7 between the two isolation rings may not flow smoothly, causing the bubbling and the bursting.

Figure 14:
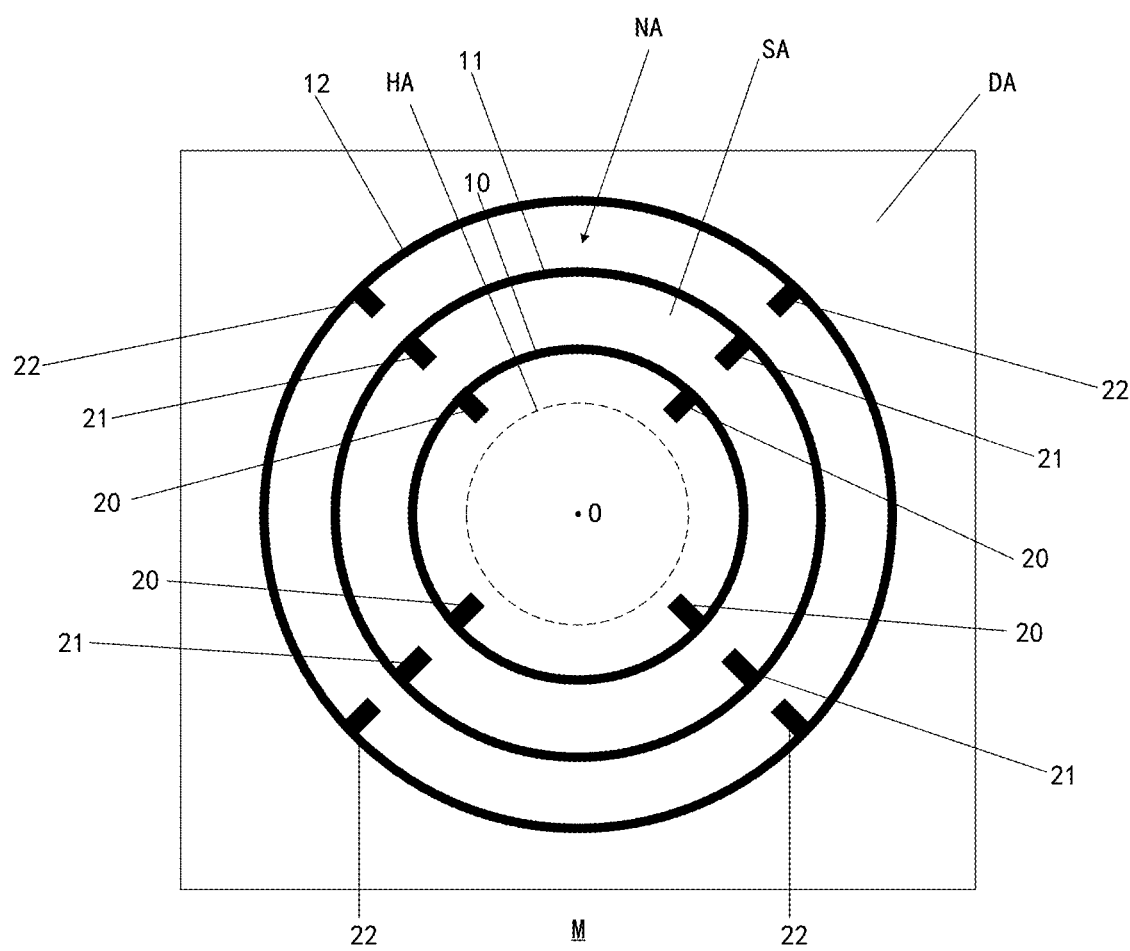
FIG. 14 schematically shows an enlarged diagram of an area M in FIG. 1.

In some embodiments, FIG. 14 schematically shows an enlarged diagram of an area M in FIG. 1. A difference between the structures of the embodiments shown in FIGS. 14 and 11 is that, for each isolation ring, a plurality of drainage structures may extend toward the center O of the each isolation ring from a sidewall of the each isolation ring that faces the opening area HA. That is, the first isolation ring 10 is provided with a plurality of first drainage structures 20 extending toward the center O of the first isolation ring 10 from a sidewall of the first isolation ring 10 that faces the opening area HA. The second isolation ring 11 is provided with a plurality of second drainage structures 21 extending toward the center O of the second isolation ring 11 from the sidewall of the second isolation ring 11 that faces the opening area HA. The third isolation ring 12 is provided with a plurality of third drainage structures 22 extending toward the center O of the third isolation ring 12 from a sidewall of the third isolation ring 12 that faces the opening area HA.

For the each isolation ring, a number of the drainage structures extending from the each isolation ring is not limited specifically, and the number may be two or more. For example, FIG. 14 shows that four drainage structures extend from the each isolation ring.

In some embodiments, as shown in FIG. 14, for the second isolation ring 11, the plurality of second drainage structures 21 extending from the second isolation ring 11 are distributed uniformly on a circumference of the second isolation ring 11. Those skilled in the art may understand that, in other embodiments, for the each isolation ring, the plurality of drainage structures extending from the each isolation ring may be distributed non-uniformly on the circumference of the each isolation ring.

In some embodiments, as shown in FIG. 14, for the second isolation ring 11, four second drainage structures 21 extending from the second isolation ring 11 may have same extension lengths d2 (shown in conjunction with FIG. 12). In this case, the gas sealed by the photoresist layer 7 between the second isolation ring 11 and an adjacent isolation ring, such as the first isolation ring 10 or the third isolation ring 12, may flow relatively smoothly.

In some embodiments, the plurality of drainage structures extending from a same isolation ring may have different extension lengths, and the extension length of each of the plurality of drainage structures may be designed as desired.

In some embodiments, for any two adjacent isolation rings in the at least one isolation ring, for example, the first isolation ring 10 and the second isolation ring 11, an extension direction of at least one first drainage structure 20 extending from the first isolation ring 10 is the same as an extension direction of at least one second drainage structure 21 extending from the second isolation ring 21.

As shown in FIG. 14, four drainage structures extend toward the first center O from an inner wall of each of the first isolation ring 10, the second isolation ring 11, and the third isolation ring 12 that faces the opening area HA. For any two adjacent isolation rings in the at least one isolation ring, for example, the first isolation ring 10 and the second isolation ring 11, four first drainage structures 20 extending from the first isolation ring 10 correspond to four second drainage structures 21 extending from the second isolation ring 11 respectively. That is, extension directions of four drainage structures extending from one of the two adjacent isolation rings is the same as extension directions of four drainage structures extending from another one of the two adjacent isolation rings respectively. Those skilled in the art may understand that, in other embodiments, for any two adjacent isolation rings in the at least one isolation ring, the four drainage structures extending from one of the two adjacent isolation rings may not correspond to the four drainage structures extending from another one of the two adjacent isolation rings. For example, in a circumferential direction of the isolation rings, the four drainage structures extending from one of the two adjacent isolation rings may also be alternately arranged with the four drainage structures extending from another one of the two adjacent isolation rings.

In some embodiments, for any two adjacent isolation rings in the at least one isolation ring, a number of drainage structures extending from each of the two adjacent isolation rings may be a same number or different numbers.

Figure 15:
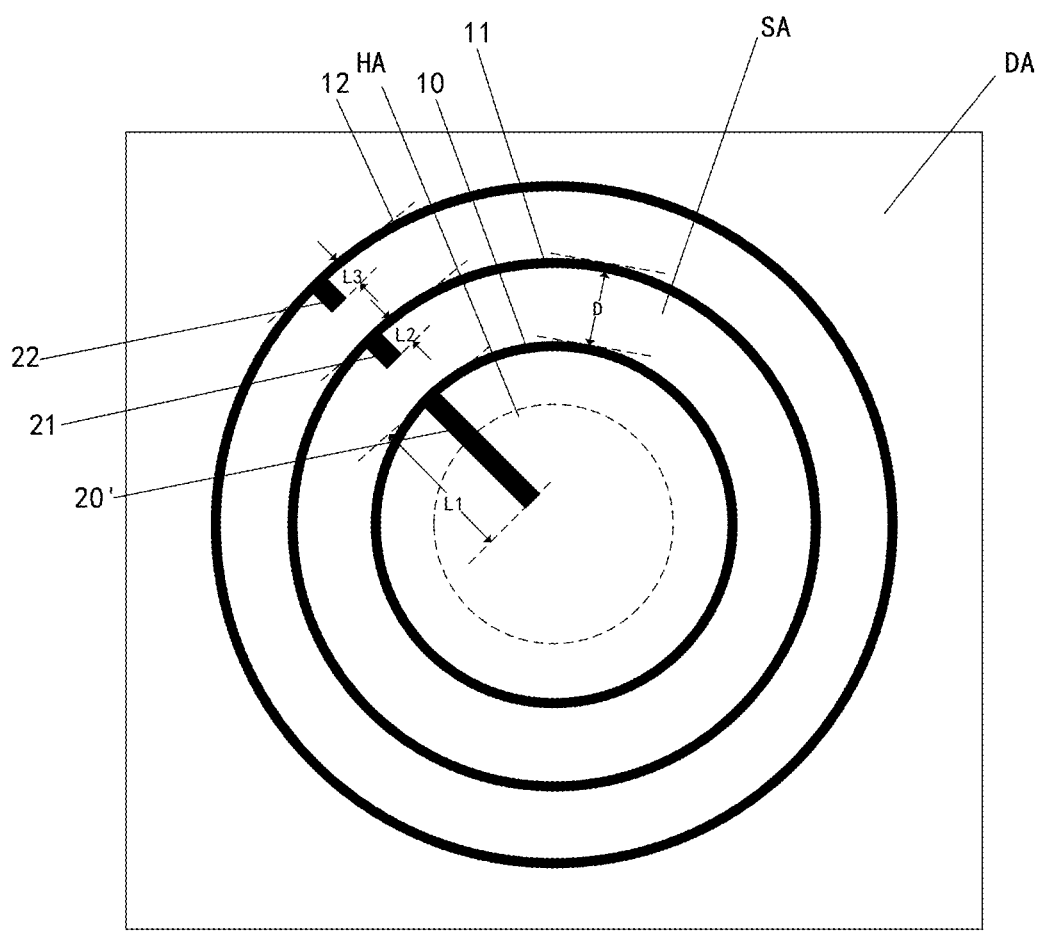
FIG. 15 schematically shows an enlarged diagram of an area M in FIG. 1.

In some embodiments, FIG. 15 schematically shows an enlarged diagram of an area M in FIG. 1. A difference between the structures of the embodiments shown in FIGS. 15 and 11 is that, for the first isolation ring 10, the second isolation ring 11, and the third isolation ring 12, an extension length L1 of the first drainage structure 20' extending from the first isolation ring 10 closest to the opening area HA may be greater than an extension length L2 of the second drainage structure 21 extending from the second isolation ring 11 and is greater than an extension length L3 of the third drainage structure 22 extending from the third isolation ring 12.

The extension length L2 of the second drainage structure 21 is limited by a distance D between the second isolation ring 11 and the first isolation ring 10. Therefore, the extension length L2 of the second drainage structure 21 may not be greater than the distance D.

For the first isolation ring 10 closest to the opening area HA, the first drainage structure 20' may extend from the first isolation ring 10 into the opening area HA, so that the first drainage structure 20' has a longer extension length L1 which is beneficial to discharge the gas sealed by the photoresist layer 7. A part of the first drainage structure 20 located in the opening area HA may be removed in a subsequent punching process.

As shown in FIGS. 11, 14, and 15, compared to the embodiments shown in FIG. 2, drainage structures are further provided into the display panel 100. The drainage structures extend toward the center of the isolation rings from the sidewalls of the isolation rings that face the opening area HA. In the process of manufacturing the display panel 100, the gas sealed by the photoresist layer 7 is discharged at edges of the drainage structures perpendicular to the extension direction of the drainage structures under the action of the drainage structures, thereby avoiding the bubbling and the bursting of the photoresist layer 7 which may lead to a defect in the subsequent formation of the anode.

In addition, as described above, taking the second isolation ring 11 as an example, the second planarization layer 42 of the second drainage structure 21 and the first planarization layer 41 of the second isolation ring 11 are arranged in a same layer, and the second planarization layer 42 of the second drainage structure 21 and the first planarization layer 41 of the second isolation ring 11 are an integral structure. The second passivation layer 52 of the second drainage structure 21 and the first passivation layer 51 of the second isolation ring 11 are arranged in a same layer, and the second passivation layer 52 of the second drainage structure 21 and the first passivation layer 51 of the second isolation ring 11 are an integral structure. That is, the second planarization layer 42 of the second drainage structure 21 and the first planarization layer 41 of the second isolation ring 11 may be formed using a same material and a same patterning process, and the second passivation layer 52 of the second drainage structure 21 and the first passivation layer 51 of the second isolation ring 11 may be formed using a same material and a same patterning process. Compared with the embodiments shown in FIG. 2, the embodiments shown in FIGS. 11, 14, and 15 may form the drainage structures without additional process steps. The same applies to the first isolation ring 10 and the third isolation ring 12 and respective drainage structures of the first isolation ring 10 and the third isolation ring 12.

Those skilled in the art may understand that, in other embodiments, taking the second isolation ring 11 as an example, the second planarization layer 42 of the second drainage structure 21 and the first planarization layer 41 of the second isolation ring 11 may be separate structures and may be formed using different materials and different patterning processes. The second passivation layer 52 of the second drainage structure 21 and the first passivation layer 51 of the second isolation ring 11 may also be separate structures and may be formed using different materials and different patterning processes.

Figure 16:
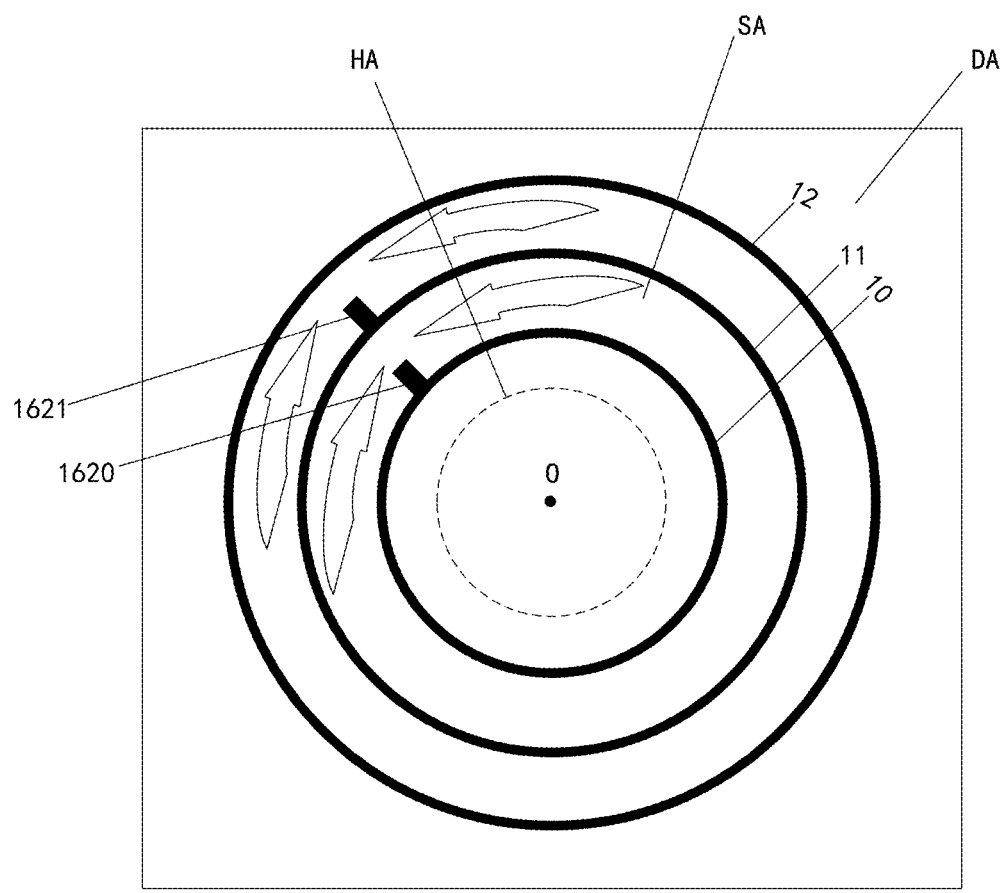
FIG. 16 schematically shows an enlarged diagram of an area M in FIG. 1.

Although in the embodiments shown in FIGS. 11, 14, and 15, the drainage structures all extend toward the center O of the isolation rings from the sidewalls of the isolation rings that face the opening area HA, those skilled in the art may understand that, in other embodiments, as shown in FIG. 16, a first drainage structure 1620 of the first isolation ring 10 may further extend from a sidewall of the first isolation ring 10 away from the center O of the first isolation ring 10, and the sidewall of the first isolation ring 10 is away from the opening area HA. A second drainage structure 1621 of the second isolation ring 11 may also extend from a sidewall of the second isolation ring 11 away from the center O of the second isolation ring 11, and the sidewall of the second isolation ring 11 is away from the opening area HA. This arrangement may also have an effect of guiding the discharge of gas. In addition, in this case, a drainage structure may not be provided on a sidewall of the third isolation ring 12 away from the opening area HA.

According to the embodiments of the present disclosure, an electronic device is provided. The electronic device includes the display panel described in any of the above embodiments. The electronic device may be a television, a monitor, a digital photo frame, a mobile phone, a smart watch, a tablet, and any product or component having a display function.

The above description is an illustration for the embodiments of the present disclosure and technical principles applied. Those skilled in the art should understand that the scope of the present disclosure is not limited to the technical solutions formed by the specific combination of the technical features described above, and may also include other technical solutions formed by any combination of the above-mentioned technical features or their equivalent features without departing from the inventive concept. For example, the above-mentioned features and the technical features disclosed in the present disclosure (but not limited to) having similar functions may be replaced with each other to form a technical solution.

What is claimed is:
1. A display panel comprising:
an opening area;
a display area surrounding the opening area;
at least one isolation ring, wherein at least a part of the at least one isolation ring is located between the display area and the opening area, and the at least one isolation ring surrounds the opening area; and a drainage structure extending from a part of a sidewall of an isolation ring in the at least one isolation ring along a straight line passing through a center of the isolation ring.

2. The display panel of claim 1, wherein the drainage structure extends from a sidewall of the isolation ring toward the opening area, and the sidewall of the isolation ring faces the opening area.

3. The display panel of claim 1, wherein the drainage structure extends from a sidewall of the isolation ring toward the display area, and the sidewall of the isolation ring is away from the opening area.

4. The display panel of claim 2, comprising:
a base substrate; and
a first isolation ring, a second isolation ring, and a third isolation ring arranged on the base substrate,
wherein the first isolation ring, the second isolation ring and the third isolation ring are sequentially arranged away from the opening area, and at least a part of the third isolation ring is located in the display area.

5. The display panel of claim 4, wherein each of the first isolation ring, the second isolation ring, and the third isolation ring comprises a first planarization layer and a first passivation layer sequentially stacked on the base substrate, wherein an orthographic projection of the first planarization layer on the base substrate falls within an orthographic projection of the first passivation layer on the base substrate, and an area of the orthographic projection of the first planarization layer on the base substrate is smaller than an area of the orthographic projection of the first passivation layer on the base substrate.

6. The display panel of claim 5, comprising a first drainage structure, a second drainage structure, and a third drainage structure, wherein the first drainage structure extends from a sidewall of the first isolation ring toward the opening area, the second drainage structure extends from a sidewall of the second isolation ring toward the opening area, and the third drainage structure extends from a sidewall of the third isolation ring toward the opening area; and
wherein each of the first drainage structure, the second drainage structure, and the third drainage structure comprises a second planarization layer and a second passivation layer sequentially stacked on the base substrate, wherein an orthographic projection of the second planarization layer on the base substrate falls within an orthographic projection of the second passivation layer on the base substrate, and an area of the orthographic projection of the second planarization layer on the base substrate is smaller than an area of the orthographic projection of the second passivation layer on the base substrate.

7. The display panel of claim 6, wherein the first planarization layer and the second planarization layer are an integral structure, and the first passivation layer and the second passivation layer are an integral structure.

8. The display panel of claim 6, wherein a width of the first planarization layer in a direction parallel to the base substrate is 3 to 10 μm, and an extension length of the second planarization layer in a direction extending from the display area toward the opening area is 1.5 to 3 μm.

9. The display panel of claim 8, wherein for two adjacent isolation rings in the at least one isolation ring, a distance between a sidewall, away from the opening area, of a first planarization layer of one of the two adjacent isolation rings and a sidewall, close to the opening area, of a first planarization layer of another one of the two adjacent isolation rings is 3 to 5 μm.

10. The display panel of claim 6, wherein the first isolation ring, the second isolation ring, and the third isolation ring are concentric, the first isolation ring, the second isolation ring and the third isolation ring have a same first center, and the first drainage structure extends toward the first center from a sidewall of the first isolation ring that faces the first center, the second drainage structure extends toward the first center from a sidewall of the second isolation ring that faces the first center, and the third drainage structure extends toward the first center from a sidewall of the third isolation ring that faces the first center.

11. The display panel of claim 10, wherein a plurality of drainage structures are provided on each of the first isolation ring, the second isolation ring, and the third isolation ring, and the plurality of drainage structures are distributed uniformly on a sidewall of each of the first isolation ring, the second isolation ring, and the third isolation ring, and the sidewall of each of the first isolation ring, the second isolation ring, and the third isolation ring faces the first center.

12. The display panel of claim 11, wherein for two adjacent isolation rings in the at least one isolation ring, an extension direction of at least one drainage structure extending from one of the two adjacent isolation rings is same as an extension direction of at least one drainage structure extending from another one of the two adjacent isolation rings.

13. The display panel of claim 11, wherein a plurality of drainage structures extending from a same isolation ring have a same extension length.

14. The display panel of claim 8, wherein an extension length of the first drainage structure extending from the first isolation ring closest to the opening area is greater than an extension length of the second drainage structure extending from the second isolation ring, and is greater than an extension length of the third drainage structure extending from the third isolation ring.

15. The display panel of claim 11, wherein for two adjacent isolation rings in the at least one isolation ring, a plurality of drainage structures extending from an isolation ring in the two adjacent isolation rings that is away from the opening area are spaced apart from an isolation ring in the two adjacent isolation rings that is close to the opening area by a distance.

16. An electronic device comprising the display panel of claim 1.

* * * * *